ABSTRACT

(12) United States Patent
Suzuki et al.

(10) Patent No.: US 6,835,318 B2
(45) Date of Patent: Dec. 28, 2004

(54) METHOD FOR FORMING A RECOGNITION MARK ON A SUBSTRATE FOR A KGD

(75) Inventors: Takeyuki Suzuki, Yokohama (JP); Noriyuki Matsuoka, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 181 days.

(21) Appl. No.: 10/067,890

(22) Filed: Feb. 8, 2002

(65) Prior Publication Data

US 2002/0117468 A1 Aug. 29, 2002

(30) Foreign Application Priority Data

Feb. 9, 2001  (JP) ..................................... 2001-034324

(51) Int. Cl.[7] .............................................. H01B 13/00
(52) U.S. Cl. ............................ 216/13; 216/14; 216/17; 216/18; 216/52; 219/121.69; 438/106
(58) Field of Search .............................. 216/13, 14, 17, 216/18, 52; 438/106; 219/121.69

(56) References Cited

U.S. PATENT DOCUMENTS

| 3,873,429 | A | * | 3/1975 | Brown | ..................... | 205/126 |
| 5,789,930 | A | * | 8/1998 | Isaacs et al. | ................ | 324/754 |
| 6,015,520 | A | * | 1/2000 | Appelt et al. | ............... | 264/104 |
| 6,133,072 | A | * | 10/2000 | Fjelstad | ..................... | 438/128 |

| 2002/0029486 | A1 | * | 3/2002 | Uchiyama et al. | ............ | 33/645 |

FOREIGN PATENT DOCUMENTS

| JP | 03192741 A | * | 8/1991 | ........... H01L/21/60 |
| JP | 04249333 A | * | 9/1992 | ........... H01L/21/60 |
| JP | 05267802 A | * | 10/1993 | ........... H05K/1/02 |
| JP | 07211750 A | * | 8/1995 | ........... H01L/21/60 |
| JP | 08125396 A | * | 5/1996 | ......... H05K/13/04 |
| JP | 10065291 A | * | 3/1998 | ........... H05K/1/02 |
| JP | 11004082 A | * | 1/1999 | ........... H05K/3/46 |
| JP | 2000165047 A | * | 6/2000 | ........... H05K/3/46 |
| KR | 97032310 A | * | 6/1997 | ........... H05K/3/00 |

* cited by examiner

Primary Examiner—Anita Alanko
(74) Attorney, Agent, or Firm—Finnegan, Henderson, Farabow, Garrett & Dunner, LLP

(57) ABSTRACT

A method for forming a recognition mark on the back surface of a substrate for a KGD that can be easily produced at a low manufacturing cost and permits repeated use of a substrate is provided. In the method, wiring patterns are formed on a surface of one side of an insulating substrate. The method includes a step of forming a conductive pattern as a recognition mark on one surface where the wiring patterns are formed, and a step of forming a through hole from a surface where the wiring pattern is not formed toward the conductive pattern. In the substrate, bumps connected with the KGD are formed on the surface on which the wiring patterns are not formed. Also, the conductive pattern may have a shape as the recognition mark or the through hole may have the shape as the recognition mark.

7 Claims, 7 Drawing Sheets

METHOD FOR FORMING A RECOGNITION MARK ON A SUBSTRATE FOR A KGD

This application is based on Patent Application No. 2001-34324 filed Feb. 9, 2001 in Japan, the content of which is incorporated hereinto by reference.

BACKGROUND OF THE INVENTION

1. Field of the Invention

The present invention relates to a method for forming a recognition mark, for performing image recognition, on a substrate as a carrier for an IC socket for inspecting a KGD (Known Good Die, namely, a good bare chip satisfying a specification). More particularly, the invention relates to a method for forming a recognition mark on a substrate in such a manner that the recognition mark can be recognized from a back surface (a surface not formed with a wiring pattern) of the substrate formed with a wiring pattern on one side.

2. Description of the Related Art

In the recent years, for higher package density on a circuit board and higher speed, it is becoming typical to surface mount a plurality of bare (namely, before packaging) LSI chips. From this, it is necessary to inspect the chip by mounting the base chip on an IC socket.

For the purpose of inspection, it is difficult to directly mount the chip on the IC socket. Therefore, a substrate as a bare chip carrier is employed.

The substrate is formed by forming a conductive wiring (wiring pattern) of copper or the like on a film form insulating substrate of polyimide or the like, namely, on a flexible insulating substrate. The wiring pattern is formed on the insulating substrate in such a manner that a conductive layer, which is formed by bonding of a conductive foil or plating, is processed to establish a predetermined wiring pattern by etching or the like.

On the substrate as set forth above, a recognition mark for performing image recognition or other processes depending upon application thereof is provided. The recognition mark is typically formed at the same time as formation of the wiring pattern with the conductive layer forming the wiring pattern.

However, in the flexible substrate, a bump can be formed on the back surface (the surface where the wiring pattern is not formed) for the purpose of electrical connection with the bare chip as exemplarily illustrated in FIGS. 5A and 5B. In the bump forming process shown in FIGS. 5A and 5B, the bump 4 is formed through the following processes. (1) At portions to form the bumps 4, holes 3 are formed in the insulating substrate 1 by laser machining from the back surface 5 of the insulating substrate where the conductive pattern is not formed (see FIG. 5A). (2) Subsequently, with resisting and plating on the insulating substrate 1, plating is selectively grown only in the portions where the holes 3 are formed to form the bumps 4 (see FIG. 5B).

As set forth above, in the substrate formed with the bumps on the back surface, the bare chip to be inspected is naturally mounted on the back surface of the substrate. Therefore, it is required for the recognition mark to be provided on the back surface of the substrate.

As a conventional method for forming the recognition mark on the back surface of the substrate, the following processes have been considered, for example:

(1) a method using an insulating substrate 1 having conductive layers on both surfaces, wherein the recognition mark 6 is formed by etching the conductive layer on the back surface 5 in similar process to formation of the wiring pattern 2 (see FIGS. 6A and 6B); and (2) a method for forming the insulating substrate of a transparent material, and then forming the recognition mark 6 together with the wiring pattern (see FIGS. 7A and 7B).

However, in case of the substrate formed with the recognition mark by the method of (1), while no problems will be encountered in using the substrate for inspecting the chip, the conductive layers are required on both surfaces of the insulating substrate. Also, two etching steps, for the front surface and the back surface, are required in a fabrication process. Thereby inherently raising of manufacturing costs.

In case of the substrate formed with the recognition mark by the method of (2), while no problems will be encountered as long as the insulating substrate is kept transparent, the insulating substrate may be tarnished by being exposed in a high temperature atmosphere resulting in difficulties in recognition. Particularly, when inspecting the KGD, since the substrate has to be exposed in a high temperature atmosphere for a long period, the substrate is not suitable for repeated use as the KGD carrier.

SUMMARY OF THE INVENTION

The present invention has been worked out for solving the drawbacks in the prior art set forth above. Therefore, it is an object of the present invention to provide a method for forming a recognition mark on a back surface of a substrate which can be fabricated in reduced manufacturing cost, is easy to manufacture and permits repeated use of the substrate formed with the recognition mark.

In order to achieve the above object of the present invention, a method for forming a recognition mark on a substrate for a KGD, wherein wiring patterns are formed on a surface of one side of an insulating substrate, is featured as comprising the following steps. The first step is forming a conductive pattern as a recognition mark on one surface where the wiring patterns are formed. The second step is forming a through hole from a surface where the wiring pattern is not formed toward the conductive pattern.

In a method for forming a recognition mark on a substrate for a KGD, the substrate is formed with a bump to be connected to the KGD on the surface where the wiring pattern is not formed.

In a method for forming a recognition mark on a substrate for a KGD, the conductive pattern may also have a particular shape as the recognition mark. Alternatively, in a method for forming a recognition mark on a substrate for a KGD, a shape of the through hole may define the recognition mark.

Further, a method for forming a recognition mark on a substrate for a KGD can be applied to the substrate that wiring patterns are formed on a plurality of layers of an insulating substrate.

The above and other objects, effects, features and advantages of the present invention will become more apparent from the following description of embodiments thereof taken in conjunction with the accompanying drawings.

BRIEF DESCRIPTION OF THE DRAWINGS

FIGS. 4A to 4C show applications of the method for forming the recognition mark according to the present invention, in which FIG. 4A is an application to the substrate having wiring on both surfaces, FIG. 4B is an application to the substrate for multi-layer interconnection boards, and FIG. 4C is an application to another substrate for multi-layer interconnection boards;

DETAILED DESCRIPTION OF PREFERRED EMBODIMENTS (First Embodiment)

Figure 1A:
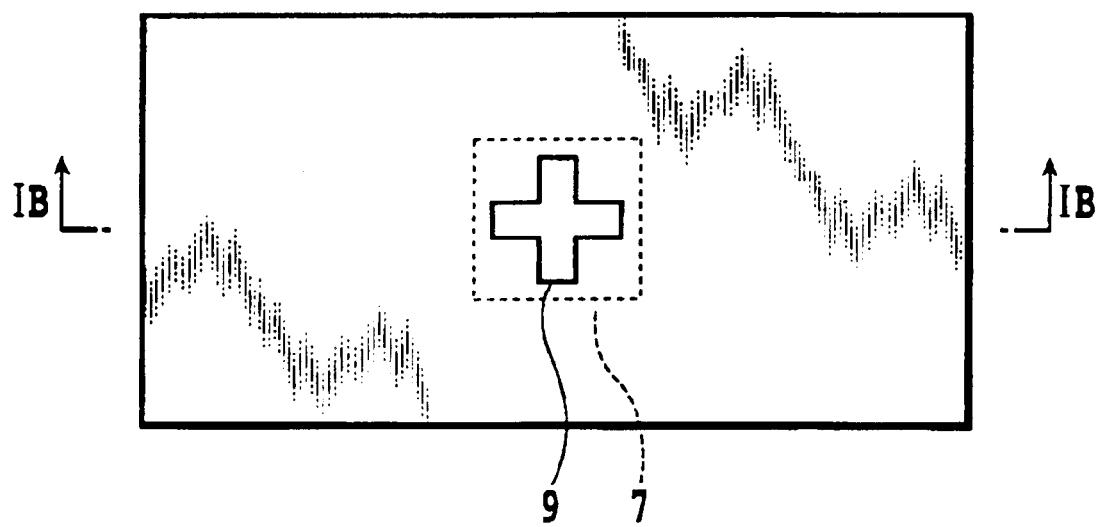
FIG. 1A is a plan view for explaining the first embodiment of a method for forming a recognition mark according to the present invention.
Figure 1B:
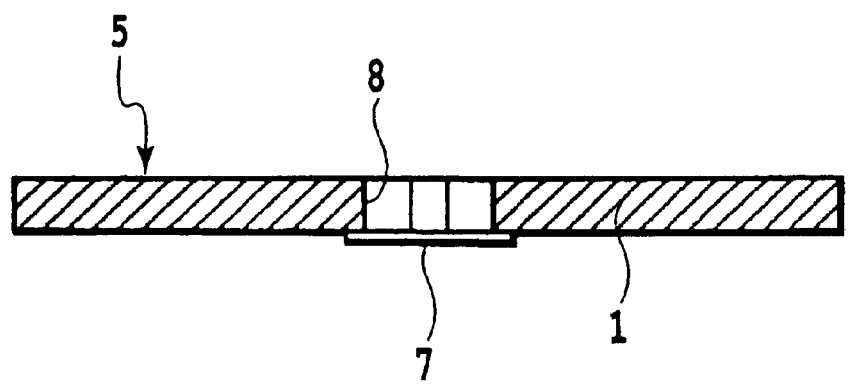
FIG. 1B is a sectional view taken along line IB—IB of FIG. 1A.

FIGS. 1A and 1B show a substrate for explaining the first embodiment of a method for forming a recognition mark according to the present invention.

In the method shown in FIGS. 1A and 1B, a conductive pattern 7 (in the shown embodiment, substantially square conductive pattern) is preliminarily formed on one side (a front surface) of an insulating substrate 1, on which a wiring pattern is to be formed. Then, a through hole 8 of an predetermined shape (in the shown embodiment, cross shape) as a recognition mark is formed at a suitable position (in the shown embodiment, substantially center position of the substrate) corresponding to a portion where the conductive pattern 7 is formed, by laser machining from a back surface 5 of the insulating substrate 1. Accordingly, in the shown embodiment, the cross-shape through hole 8 per se or the conductive pattern 7 appeared as cross-shape from the back surface is considered as the recognition mark.

It should be understood that the conductive pattern 7 to be formed in the shown embodiment can be formed simultaneously with formation of the wiring pattern by etching or the like. It should be also understood that the cross shape through hole 8 can be formed by laser machining simultaneously with formation of holes for bumps.

The shapes of the conductive pattern 7 and the through hole 8 should not be limited respectively to the square shape and the cross shape. Namely, the shape of the conductive pattern 7 may be a simple shape, such as circular shape, quadrangular shape and so on, and the shape of the through hole 8 may be any particular shape as the recognition mark to be formed within the area of the conductive pattern 7. Thus, both shapes may be any arbitrarily selected shapes. Furthermore, both are formed at positions other than the positions of the bumps.

As set forth above, with the shown embodiment of the method for forming the recognition mark, the recognition mark can be easily formed on the back surface of the substrate without adding a special manufacturing step.

(Second Embodiment)

Figure 2A:
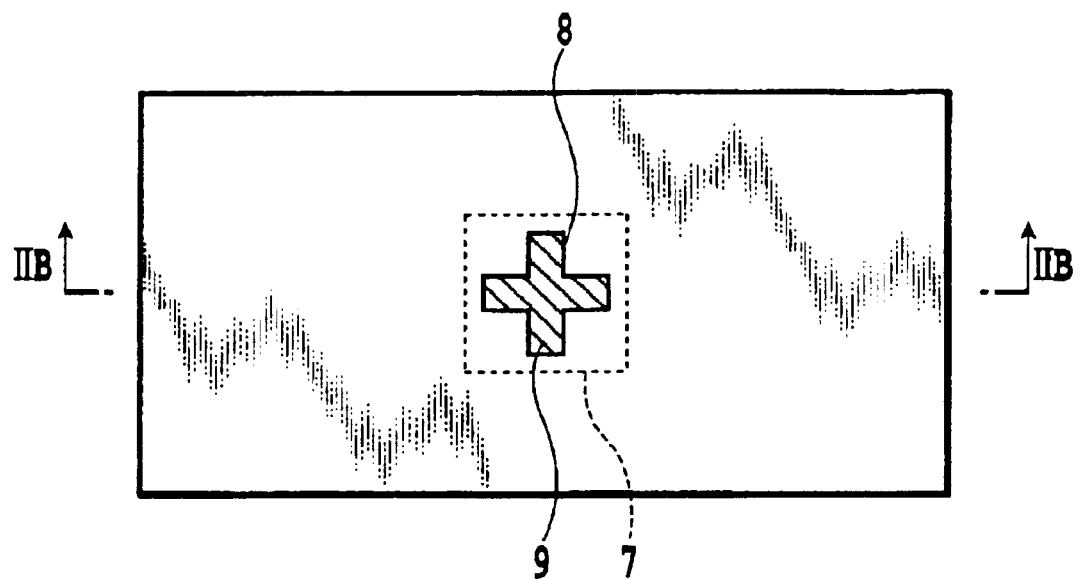
FIG. 2A is a plan view for explaining the second embodiment of a method for forming a recognition mark according to the present invention.
Figure 2B:
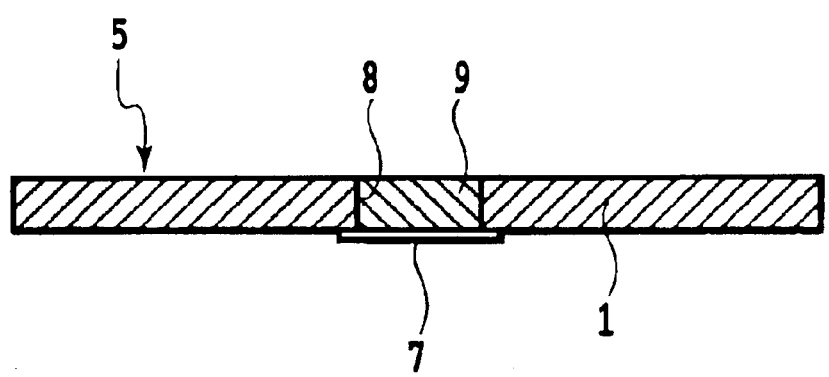
FIG. 2B is a sectional view taken along line IIB—IIB of FIG. 2A.

FIGS. 2A and 2B show a substrate for explaining the second embodiment of a method for forming the recognition mark according to the present invention.

In the method shown in FIGS. 2A and 2B, the through hole 8 formed by the method of the first embodiment, is filled with plating 9 or the like to be flush with the back surface, so that the cross-shaped plating 9 is considered as the recognition mark in the shown embodiment. It should be noted that plating is a preferred material to fill the hole, so that the recognition mark may be formed simultaneously with formation of bumps. However, the material to fill the hole is not necessarily the plating as in the shown embodiment, but can be any suitable material. For instance, a material of a color different from the color of the insulating substrate may be used.

Even in the method of the shown embodiment, the recognition mark can be easily formed on the back surface of the substrate without adding any additional manufacturing steps. Furthermore, since the recognition mark is formed flush with the back surface, focusing on the recognition mark is facilitated.

(Third Embodiment)

Figure 3A:
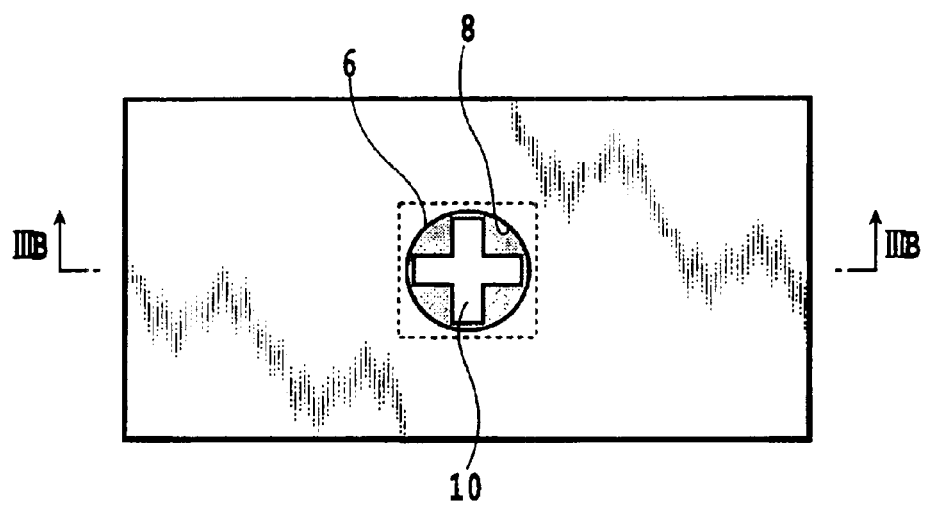
FIG. 3A is a plan view for explaining the third embodiment of a method for forming a recognition mark according to the present invention.
Figure 3B:
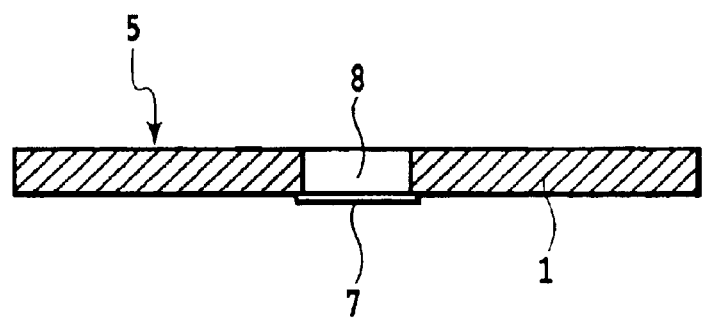
FIG. 3B is a sectional view taken along line IIIB—IIIB of FIG. 3A.

FIGS. 3A and 3B show a substrate for explaining the third embodiment of a method for forming the recognition mark according to the present invention.

In the method shown in FIGS. 3A and 3B, the shapes of the conductive pattern 7 and the through hole 8 are reversed from the shapes in the first embodiment. Namely, the shape of the through hole 8 is simple shape, such as circular shape, quadrangular shape or the like and the shape of the conductive pattern 7 is a particular shape as the recognition mark formed within the area of the through hole 8.

As a concrete method for formation, in a similar manner as the first embodiment, a conductive pattern 7 (in the shown embodiment, the conductive pattern, in which substantially cross-shaped punched hole 10 is formed) is preliminarily formed on one side (a front surface) of an insulating substrate 1, on which a wiring pattern is to be formed. Then, a through hole 8 of an predetermined shape (in the shown embodiment, circular shape) is formed at a suitable position (in the shown embodiment, substantially center position of the substrate) corresponding to a portion where the conductive pattern 7 is formed, by laser machining from a back surface 5 of the insulating substrate 1. In the shown embodiment, the cross shape punched hole 10 is taken as the recognition mark to be recognized from the back surface side.

Figure 3C:
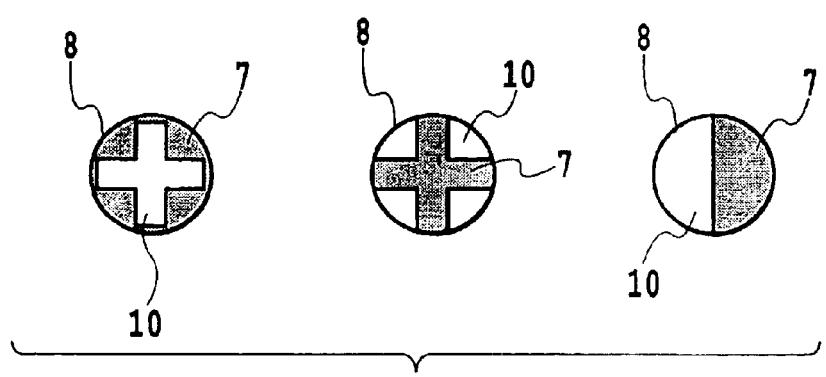
FIG. 3C is showing variations of combination of conductive patterns and through holes.

The shape of the recognition mark is not limited to the cross-shaped punched hole 10 as in the shown embodiment but can be any particular shape recognizable as the recognition mark in the through hole 8. For example, any shapes as shown in FIG. 3C may be employed. As the case may be, a part of the wiring pattern may be used as the recognition mark.

Even in the shown embodiment, the recognition mark can be easily formed on the back surface of the substrate without adding any additional manufacturing steps. Furthermore, since the through hole in simple shape is required to be formed so that a particular shape as the recognition mark can be recognized, particular precision is not required in forming the through-hole.

(Other Embodiment)

Figure 4A:
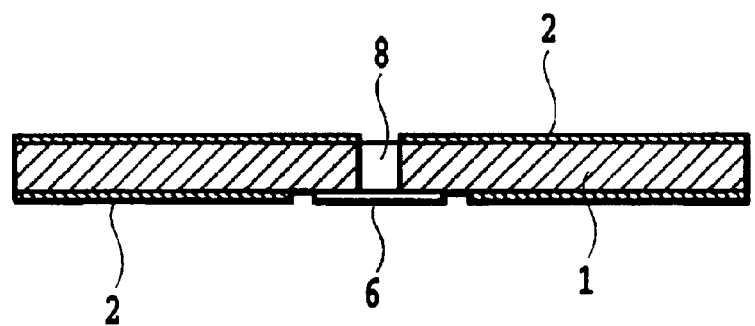
Figure 4B:
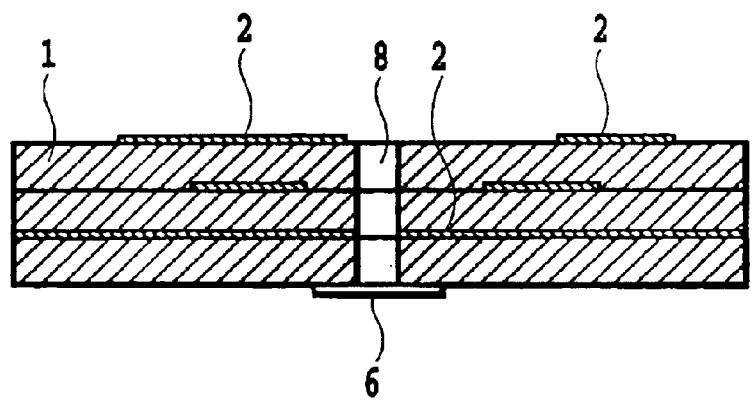
Figure 4C:
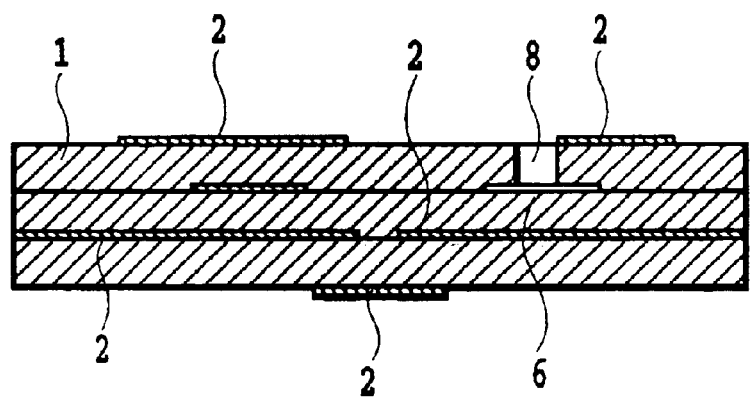
Figure 5A:
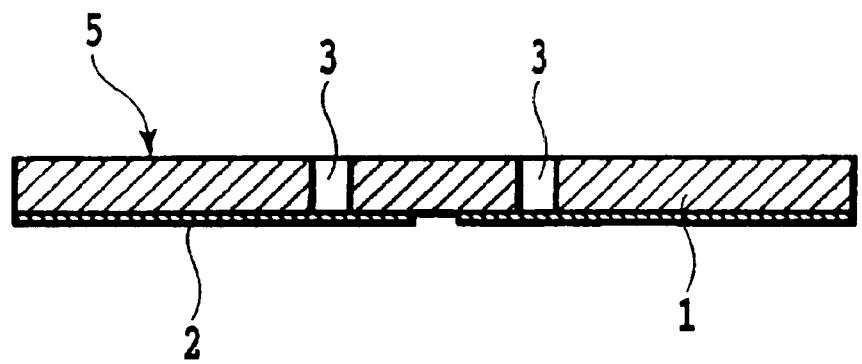
FIGS. 5A and 5B are sectional views showing prior art in forming bumps in the substrate.
Figure 5B:
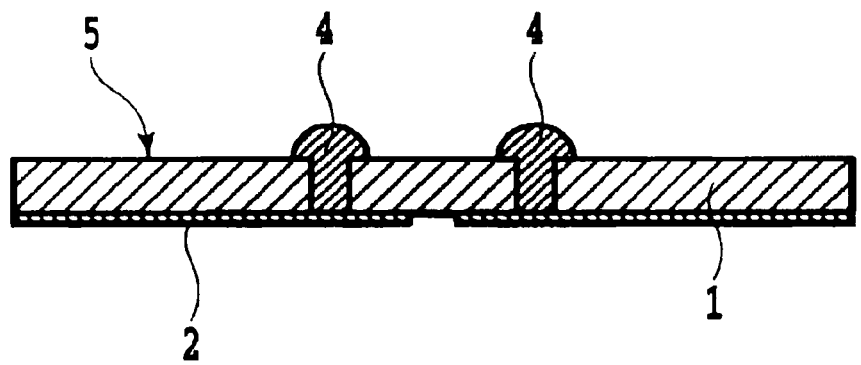
Figure 6A:
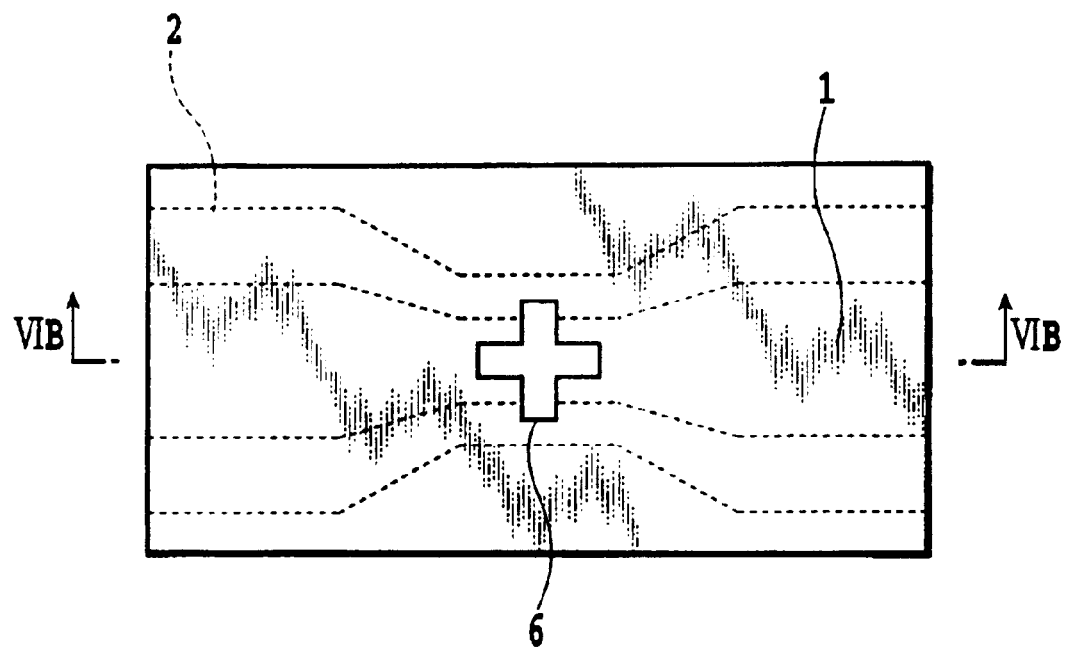
FIG. 6A is a plan view for explaining the first prior art of a method for forming a recognition mark.
Figure 6B:
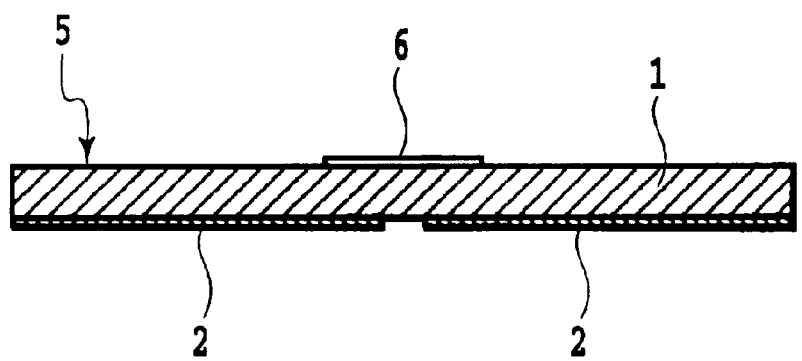
FIG. 6B is a section taken along line VIB—VIB of FIG. 6A.
Figure 7A:
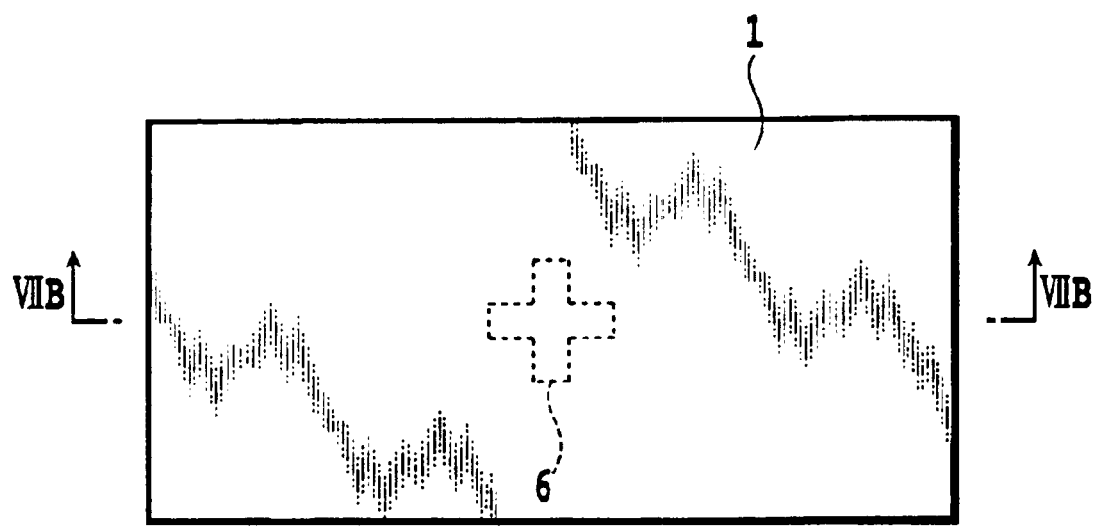
FIG. 7A is a plan view for explaining the second prior art of a method for forming a recognition mark.
Figure 7B:
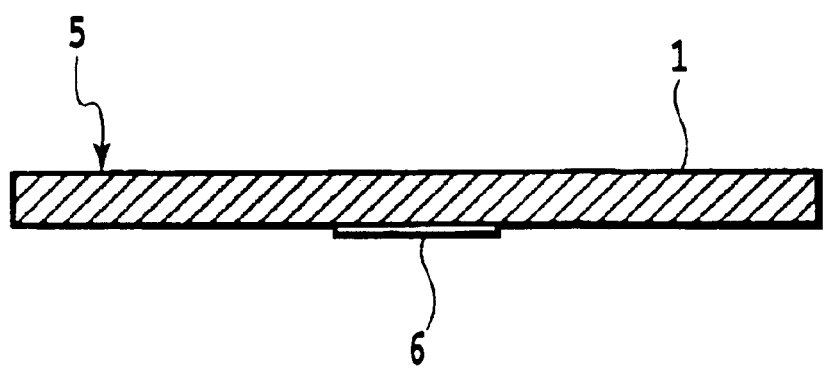
FIG. 7B is a sectional view taken along line VIIB—VIIB of FIG. 7A.

In FIGS. 4A to 4C, several examples of application of the first embodiment of the method for forming the recognition mark will be explained.

In an application shown in FIG. 4A, a substrate is formed with wiring pattern 2 on both surfaces of the insulating substrate 1. In this case, together with the wiring pattern on the surface not connected to the chip, the conductive pattern 6 as the recognition mark is formed so as to be visible through the through hole 8.

In applications shown in FIGS. 4B and 4C, a substrate is formed with wiring patterns in multiple layers. In these cases, the conductive layer 6 as the recognition mark is formed together with the wiring pattern in arbitrary layer other than the layer connected to the chip, e.g. the lowermost layer in case of FIG. 4B and second layer in case of FIG. 4C.

As set forth above, with the method for forming the recognition mark according to the present invention, the recognition mark can be formed in the arbitrary layer in the substrate of the multiple layer structure to increase freedom in designing and forming of the wiring pattern.

As set forth above, since the method for forming the recognition mark on the back surface of the substrate for KGD inspection socket is adapted for the substrate having the wiring pattern formed on one surface of the insulating substrate, forms the conductive pattern as the recognition mark on one surface where the wiring pattern is formed, and forms a through hole from the surface where the wiring pattern is not formed, toward the conductive pattern, the recognition pattern can be easily formed on the back surface of the substrate without requiring any additional process steps. As a result, it becomes possible to provide a substrate which can be used repeatedly and is inexpensive.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A method for forming a recognition mark on a substrate for a bare chip carrier of a KGD, said substrate having a front surface and a back surface, comprising the steps of:

forming wiring patterns on the front surface;

forming a conductive pattern as a recognition mark on the front surface; and forming a through hole from the back surface toward said conductive pattern.

2. A method for forming a recognition mark on a substrate for a bare chip carrier of a KGD as claimed in claim 1, wherein said substrate is formed with a bump on the back surface.

3. A method for forming a recognition mark on a substrate for a bare chip carrier of a KGD as claimed in claim 1, wherein said conductive pattern has a particular shape as said recognition mark.

4. A method for forming a recognition mark on a substrate for a bare child carrier of a KGD as claimed in claim 1, wherein a shape of said through hole defines said recognition mark.

5. A method for forming a recognition mark on a substrate for a bare chip carrier of a KGD as claimed in claim 4, wherein said through hole is filled with a plating material until the end of said plating lies in flush with said surface where said wiring pattern is not formed.

6. A method for forming a recognition mark on a substrate for a bare carrier of a KGD, said substrate having a front surface and a back surface, comprising the steps of:

forming wiring patterns on the front surface and the back surface;

forming a conductive pattern as a recognition mark on the front surface; and forming a through hole from the back surface toward said conductive pattern.

7. A method for forming a recognition mark on a substrate for a bare carrier of a KGD, said substrate having a plurality of layers and said plurality of layers including a back surface, comprising the steps of:

forming wiring patterns on one or more of the layers;

forming a conductive pattern as a recognition mark on any layer where said wiring patterns are formed; and forming a through hole from the back surface toward said conductive pattern;

wherein forming the conductive pattern is performed at the same time as forming the wiring patterns.

* * * * *

UNITED STATES PATENT AND TRADEMARK OFFICE
CERTIFICATE OF CORRECTION

| | | |
|---|---|---|
| PATENT NO. | : 6,835,318 B2 | Page 1 of 1 |
| APPLICATION NO. | : 10/067890 | |
| DATED | : December 28, 2004 | |
| INVENTOR(S) | : Takeyuki Sazuki et al. | |

It is certified that error appears in the above-identified patent and that said Letters Patent is hereby corrected as shown below:

Column 6, line 15, "child" should read --chip--;

Column 6, line 24, "bare carrier" should read --bare chip carrier--; and

Column 6, line 33, "bare carrier" should read --bare chip carrier--.

Signed and Sealed this

Twenty-seventh Day of February, 2007

JON W. DUDAS
*Director of the United States Patent and Trademark Office*